United States Patent [19]
Kurtzke et al.

[11] Patent Number: 5,400,164
[45] Date of Patent: * Mar. 21, 1995

[54] POLARIZATION-INSENSITIVE OPTICAL FOUR-PHOTON MIXER

[75] Inventors: Christian Kurtzke; Jay M. Wiesenfeld, both of Monmouth, N.J.

[73] Assignee: AT&T Corp., Murray Hill, N.J.

[*] Notice: The portion of the term of this patent subsequent to Nov. 15, 2011 has been disclaimed.

[21] Appl. No.: 120,013

[22] Filed: Sep. 10, 1993

[51] Int. Cl.$^6$ .......................... H04B 10/00; H01S 3/00
[52] U.S. Cl. ..................................... 359/156; 359/160; 359/183; 359/326; 359/338; 372/21; 385/122
[58] Field of Search ............... 359/122, 134, 156, 160, 359/183, 191–193, 334, 338, 341, 326–327; 372/6, 21; 385/11, 122, 14, 24, 43

[56] References Cited

U.S. PATENT DOCUMENTS
4,900,917  2/1990  Dixon et al. ........................ 359/156

FOREIGN PATENT DOCUMENTS
0500357  8/1992  European Pat. Off. ............. 359/160
0046637  2/1991  Japan .................................. 359/122

OTHER PUBLICATIONS

Alferness, R. C., Buhl, L. L., Divino, M. D., Joyner, C. H., Dentai, A. G., and Martyak, M. J. R., "Narrowband GaInAsP/InP Waveguide Grating-Folded Directional Coupler Multiplexer/Demultiplexer," Electronics Letters, vol. 24, No. 3, Feb. 4, 1988, pp. 150–151.

Alferness, R. C., Koch, T. L., Buhl, L. L., Storz, F., Heismann, F. and Martyak, M. J. R., "Grating-Assisted InGaAsP/InP Vertical Codirectional Coupler Filter," Appl. Phys. Letters, vol. 55, No. 19, Nov. 6, 1989, pp. 2011–2013.

Alferness, R. C., Buhl, L. L., Koren, U., Miller, B. I., Young, M. and Koch, T. L., "Vertically Coupled InGaAsP/InP Buried Rib Waveguide Filter," Appl. Phys. Letters, vol. 59, No. 20, Nov. 11, 1991, pp. 2573–2575.

Dragone, C., "An N×N Optical Multiplexer Using A Planar Arrangement Of Two Star Couplers," IEEE Photonics Technology Letters, vol. 3, No. 9, Sep. 1991, pp. 812–815.

Gnauck, A. H., Jopson, R. M., and Derosier, R. M., "10-Gb/s 360-km Transmission Over Dispersive Fiber Using Midsystem Spectral Inversion," IEEE Photonics Technology Lectures, vol. 5, No. 6, Jun. 1993, pp. 663–666.

Hansen, P. B., Raybon, G., Chien, M. D., Koren, U., Miller, B. I., Young, M. G., Verdiell, J. M. and Burrus, C. A., "A 1.54-$\mu$m Monolithic Semiconductor Ring Laser: CW and Mode-Locked Operation," IEEE Photonics Letters, vol. 4, No. 5, May 1992, pp. 411–413.

Hasegawa, Takasi, Inoue, Kyo, Oda, Kazuhiro, and Hiromu, Toba, "Multi-Channel Frequency Conversion Over 1 THz Using Fiber Four-Wave Mixing," Post Deadline Digest of the Optical Amplifiers and their Applications Conference, Paper PD7, Jul. 4–6, 1993, Yokohama, Japan.

Yariv, Amnon, Fekete, Dan and Pepper, David M., "Compensation for Channel Dispersion by Nonlinear Optical Phase Conjugation," Optics Letters, vol. 4, 1979, pp. 52–54.

*Primary Examiner*—Herbert Goldstein
*Assistant Examiner*—Kinfe-Michael Negash

[57] ABSTRACT

The present invention provides an apparatus and method for performing polarization-insensitive four-photon mixing of optical signals. The polarization-insensitive optical mixer includes a polarization splitter for splitting an optical signal into parallel and perpendicular polarization components, different mixing paths for mixing a pump signal of like polarization with each of the parallel and perpendicular components in a nonlinear mixing device, and a polarization combiner for combining the resulting mixing products. Certain of the mixing products represent phase conjugates of the input optical signal, and are therefore useful in compensating for chromatic distortion in optical fiber.

33 Claims, 6 Drawing Sheets

POLARIZATION-INSENSITIVE OPTICAL FOUR-PHOTON MIXER

BACKGROUND OF THE INVENTION

1. Field of the Invention

The present invention relates generally to improvements in optical communication systems. Note particularly, the present invention relates to techniques for phase conjugating and/or frequency converting optical signals in an optical communication system using four-photon mixing.

2. Description of Prior Art

Optical communication typically involves transmitting high bit rate digital data over silica glass fiber by modulating a laser or other optical signal source. Although glass fiber has a very broad bandwidth, on the order of 40,000 THz, the maximum data rate which can be transmitted across a given length of fiber is limited by chromatic dispersion and nonlinearities within the fiber. Dispersion and nonlinearities spread an optical signal in time and frequency, respectively, as it propagates through the fiber. Chromatic dispersion, often simply called dispersion, refers to a phenomenon in which the speed of an optical signal through the fiber varies as a function of the optical signal frequency or wavelength. Chromatic dispersion is generally considered linear to the first order as a function of wavelength, and second order dispersion is therefore approximated to be zero. Nonlinearities, on the other hand, involve changes in the propagation speed of an optical signal as a function of the signal amplitude or intensity. One commonly encountered nonlinearity is the Kerr effect, in which the fiber index of refraction increases with increasing optical signal amplitude. For systems transmitting at a given data rate, these dispersion and nonlinear effects limit the achievable non-regenerated transmission distance. As a result, for long-haul optical communication links, it is necessary to either control, compensate or suppress dispersion and nonlinearity, or use regenerative repeaters along the fiber transmission path.

One of the known techniques for compensating first order chromatic dispersion effects in fiber uses midsystem optical phase conjugation to balance the first-order dispersion occurring in the first half of a fiber transmission span with that occurring in the second half of the span. Because phase conjugating a given signal reverses its phase, mid-span conjugation allows the effects of first order dispersion in each half of the span to cancel out. See A. Yariv, D. Fekete and D. Pepper, "Compensation for channel dispersion by nonlinear optical phase conjugation", Optics Letters, vol. 4, pp. 52–54, 1979. By counteracting first order linear dispersive effects in this manner, midsystem optical phase conjugation has extended the bit rate distance product achievable over the anomalous dispersion fiber which make up much of the world's existing fiber communication channels. See A. Gnauck, R. Jopson and R. Derosier, "10 Gb/s 360 km Transmission over Dispersive Fiber Using Midsystem Spectral Inversion", IEEE Photonics Technology Letters, vol.5, no.6, Jun. 1993. It can be seen, therefore, that in optical communication systems it is often desirable to produce the phase conjugate of an optical signal.

Phase conjugation of optical signals is typically performed using four-photon mixing, also commonly referred to as four-wave mixing. Four-photon mixing is a nonlinear optical process which produces mixing products by mixing an input optical communication signal with one or more higher power optical signals, or pumps, in a nonlinear mixing medium such as a semiconductor laser, a semiconductor laser amplifier or a length of dispersion-shifted optical fiber. However, efficiency of the four-photon mixing process depends upon the relative polarizations of the optical signal and the pump. Since the signal polarization in a fiber-optic communications link varies randomly with time, or can become depolarized, it is difficult to maintain optimal efficiency in the four-photon mixing process by controlling the input signal polarization. Thus, the efficiency of the four-photon mixing process will vary randomly. Since failure to maintain proper polarization alignment between the signal and the pump will result in a decrease in mixing product signal power, mixer output power will also vary randomly. In the case of four-photon mixing to obtain a phase conjugate, the advantages of optical phase conjugation would often be more than offset by such variation in conjugated signal power.

A recently demonstrated experimental technique attempts to alleviate polarization sensitivity of the four-photon mixing process by using a polarization beam splitter and a fiber loop to produce and mix orthogonally-polarized versions of both the incoming optical signal and the pump. See T. Hasegawa et al., "Multi-Channel Frequency Conversion Over 1 THz Using Fiber Four-Wave Mixing", Post Deadline Digest of the Optical Amplifiers and their Applications Conference, paper PD7, Jul. 4–6, 1993, Yokohama, Japan. Although the Hasegawa fiber loop four-photon mixing technique apparently reduces the sensitivity of the mixing process efficiency to incoming signal polarization, it suffers from a number of significant drawbacks. For example, a polarization controller is required in the fiber loop in order to effectuate the proper recombination of the different polarizations of the mixing products. This leads to additional hardware costs both for the polarization controller itself as well as for any additional devices required to appropriately adjust the polarization controller. Furthermore, the fiber loop requires relatively long lengths of dispersion-shifted or non-dispersive fiber to serve as a nonlinear medium for four-photon mixing. Thus the technique is not compact and cannot be implemented in a commercially advantageous form such as a photonic integrated circuit.

As is apparent from the above, a need exists for a polarization-insensitive optical mixing technique which maintains the optimal relationship between signal and pump polarization so as to produce maximum frequency converted and/or conjugated signal output power regardless of the time-dependent state of the input signal polarization. Maximum benefit will thereby be obtained from dispersion compensation techniques utilizing optical phase conjugation. The optical mixer should not require a polarization controller or other manual or automated adjustment hardware. Furthermore, the optical four-photon mixer should be useful with any nonlinear mixing device, and therefore suitable for implementation in the form of a photonic integrated circuit.

SUMMARY OF THE INVENTION

The present invention provides a polarization-insensitive optical mixer particularly well-suited for use in optical phase conjugation. The polarization-insensitive optical mixer of the present invention includes a polarization splitter for splitting an optical signal into its parallel and perpendicular polarization components; a first mixing path with a nonlinear mixing device for mixing the parallel component of the optical signal input with a first pump signal having a polarization substantially aligned with the polarization of the parallel component; a second mixing path with a nonlinear mixing device for mixing the perpendicular component of the optical signal input with a second pump signal having a polarization substantially aligned with the polarization of the perpendicular component; and a polarization combiner to combine mixing products of the pump signals and the parallel and perpendicular components of the optical signal. The first and second mixing paths have a substantially equivalent optical length such that mixing product components may be properly recombined in the optical domain. The mixing products include frequency shifted and phase conjugated versions of the input optical signal.

In accordance with one aspect of the present invention, each of the two separate mixing paths in the polarization-insensitive four-photon mixer includes a pump source for producing the pump signal for that path, and a beam combiner which combines the pump signal with the appropriate polarization component of the optical signal. The nonlinear mixing device within each patch receives the pump and optical signal from the beam combiner and produces mixing products, two or more of which represent phase conjugates of the input optical signal.

As a feature of the present invention, the polarization-insensitive mixer maintains the optimal relationship between input signal and pump polarizations so as to produce maximum mixing product output power regardless of input signal polarization. The present invention therefore ensures that maximum bit rate distance product improvement can be obtained using, for example, phase conjugation dispersion compensation techniques.

As another feature of the present invention, the polarization-insensitive mixer does not utilize a polarization controller or other hardware which requires adjustment to optimize mixing product output power. It therefore significantly reduces the design, manufacturing and operation costs heretofore associated with achieving polarization insensitivity in optical mixing.

As a further feature of the present invention, the resulting polarization insensitivity is not dependent upon a particular type of mixing device or process. Any suitable mixing device or medium may be used. For example, substantially equivalent lengths of polarization-maintaining fiber could be used as a mixing medium in each mixing path. In the many applications in which device size is an important limitation, the present invention may be readily implemented in the form of a photonic integrated circuit by using semiconductor lasers, semiconductor laser amplifiers, or passive semiconductor material as mixing devices.

The above-discussed features, as well as additional features and advantages of the present invention, will become apparent by reference to the following detailed description and accompanying drawings.

DETAILED DESCRIPTION

The present invention involves a polarization-insensitive optical mixing technique which is suitable for use in phase conjugation or frequency conversion of optical communication signals. Although the following detailed description illustrates the utility of the present invention primarily in terms of optical phase conjugation using semiconductor laser amplifiers as a mixing medium, it should be understood that this is by way of example and not limitation. The present invention provides advantages in other applications which require polarization-insensitive optical mixing, such as optical frequency conversion and channel inversion. Furthermore, the advantages of the present invention are not limited to the context of optical four-photon mixing, but are instead also applicable to other mixing processes in which mixing efficiency is a function of signal polarization. These other mixing processes include parametric amplification and sum or difference frequency generation.

Figure 1:
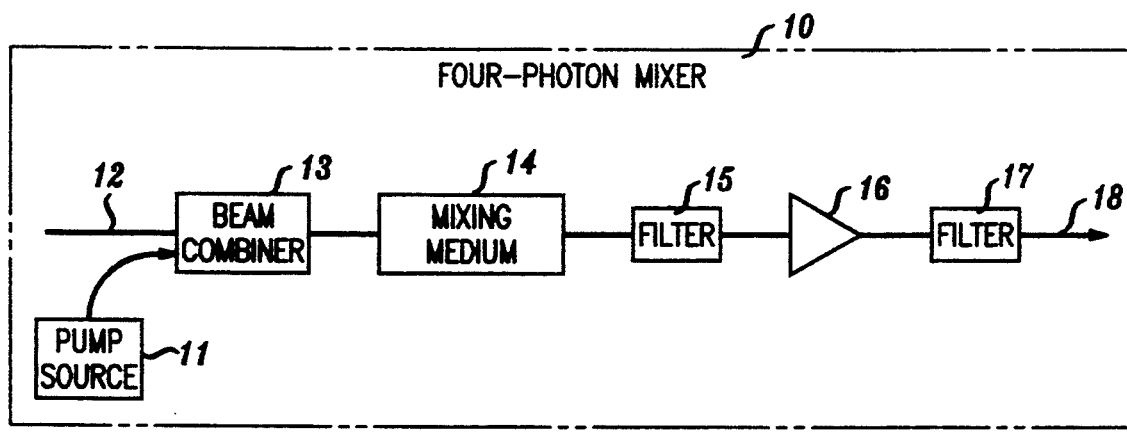
FIG. 1 is an exemplary four-photon mixer using a semiconductor laser amplifier as a mixing device in accordance with the prior art.

As previously mentioned, four-photon mixing is a nonlinear process which produces mixing products by mixing an input optical communication signal with one or more higher power pump signals, or pumps, in a nonlinear mixing medium such as a semiconductor laser, a semiconductor laser amplifier, semiconductor material or a length of optical fiber. An exemplary prior art four-photon mixer is shown in FIG. 1. The four-photon mixer 10 has a pump source 11 and an optical signal input 12. The pump source 11 produces a pump signal, often simply referred to as a pump, which is combined with an input optical signal 12 in beam combiner 13. The combined signal is supplied to semiconductor laser amplifier 14 which serves as a nonlinear mixing medium. Filter 15 separates the desired mixing product from the original signal, the pump and the undesired mixing products. The desired mixing product is then amplified in optical amplifier 16 and finally filtered again by filter 17 to remove the amplified spontaneous emission (ASE) noise from desired signal output 18. The signal output 18 may be a phase conjugate of the input signal 12 or any other desired mixing product.

Figure 2:
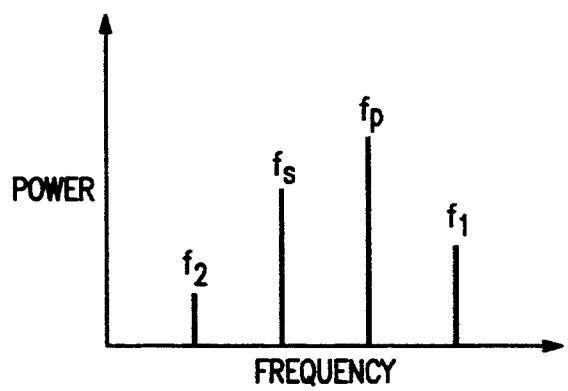
FIG. 2 is an exemplary frequency spectrum showing the phase conjugate mixing products resulting from degenerate four-photon mixing of optical communication and pump signals in the device shown in FIG. 1.

Four-photon mixing may be either non-degenerate or degenerate. In non-degenerate four-photon mixing, two distinct pumps mix with the incoming optical signal to produce the fourth signal. For an optical signal of frequency fs, a first pump of frequency fp1, and a second pump of frequency fp2, the non-degenerate mixing process produces a phase conjugate of the optical signal at a frequency fp1+fp2−fs, as well as the frequencies 2fp1−fs and 2fp2−fs. In degenerate four-photon mixing, two of the mixing signals are supplied by a single pump. Thus, for an optical signal of frequency fs and a pump at frequency fp, degenerate four-photon mixing produces a phase conjugate of the input optical signal at f1=2fp−fs and a phase conjugate of the pump at f2=2fs−fp. The frequency components fs, fp, f1 and f2 associated with degenerate four wave mixing are illustrated in FIG. 2. When the pump power is greater than the optical signal power, the power level of f1 is greater than the power level of f2. Although this is the typical case, the pump power may also be less than the optical signal power. The component f1 may be used as a phase conjugate of fs in order to cancel the dispersive effects in a given length of fiber.

In order to optimize the efficiency of the above-described four-photon mixing process, the polarization of the pump or pumps should be substantially aligned with the polarization of the input optical signal being mixed. A pump signal with a polarization aligned with that of the input signal may be referred to as having a polarization parallel to that of the input signal. Perfectly aligned signal and pump polarizations will produce mixing products having maximum signal power. In practice, the polarizations of the pump or pumps may be set and maintained at any desired value. However, the polarization of the incoming signal to be converted typically varies in a random manner or may become depolarized, and is therefore very difficult to control. In four-photon mixing used for optical phase conjugation, failure to properly align the polarization of the signal and the pump may result in a substantial time-varying reduction in conjugated signal output power of up to 10 to 20 dB or more. In optical communication systems, such a reduction in conjugated signal power is prohibitively large, and would significantly degrade system signal-to-noise ratio.

Figure 3:
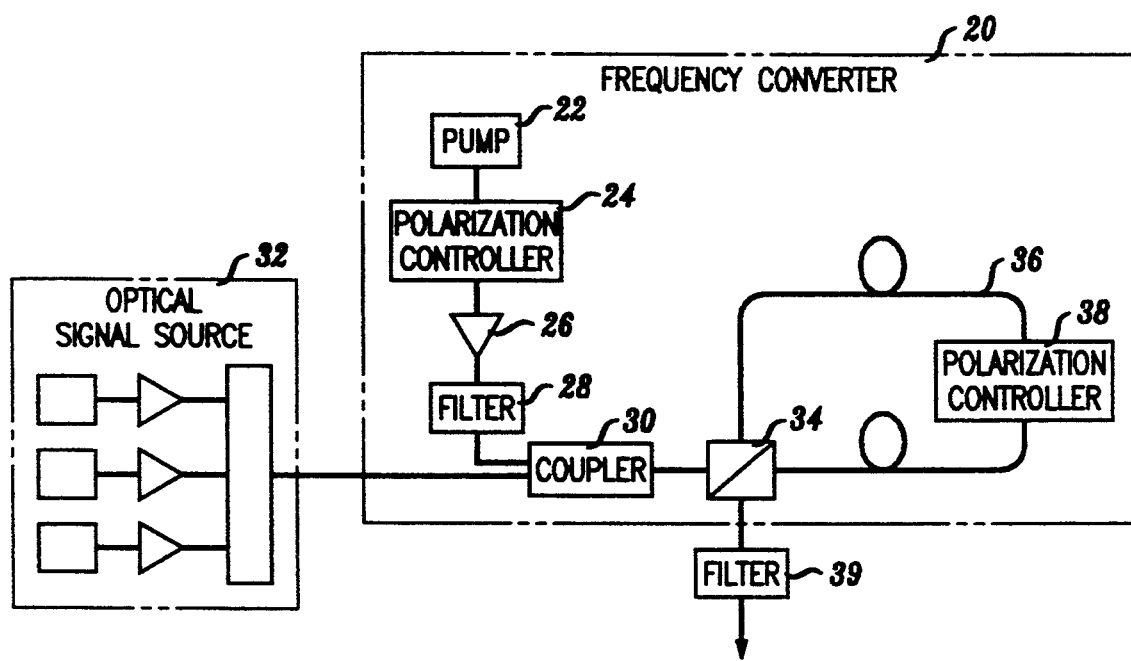
FIG. 3 is a schematic diagram illustrating a polarization-insensitive fiber loop four-photon mixing technique in accordance with the prior art.

Polarization insensitivity permits proper alignment of pump and signal polarizations without controlling or detecting the input signal polarization. FIG. 3 shows a prior art polarization-insensitive frequency convertor which uses fiber four-photon mixing to generate mixing products which are frequency shifted versions of the input optical signal. In this frequency convertor 20 a laser diode pump 22 supplies a pump signal through polarization controller 24, amplifier 26 and filter 28. The pump signal is then combined in coupler 30 with an optical signal produced in optical signal source 32. The combined pump and signal are then supplied to a polarizing beam splitter 34, which separates the combined pump and signal into orthogonally polarized parallel and perpendicular components. The polarizing beam splitter 34 supplies the orthogonal polarizations of the pump and the signal to a fiber loop 36 consisting of two 5 km rolls of dispersion-shifted fiber, separated by a polarization controller 38. The fiber loop 36 thus serves as a nonlinear medium for four-photon mixing, producing frequency shifted products at 2fp−fs and 2fs−fp. One polarization of the input signal mixes with the same polarization of the pump signal in one direction through the fiber, while the other polarization mixes with its corresponding pump signal polarization in the other direction. The resulting mixing products are recombined in the polarizing beam splitter and separated using filter 39. The polarization controller 38 must be adjusted to output the proper polarizations of converted signal back into the polarization beam splitter 34. As discussed in greater detail above, this prior art polarization-insensitive frequency convertor has a number of drawbacks, such as the need for a polarization controller and the use of a fiber mixing medium.

Figure 4:
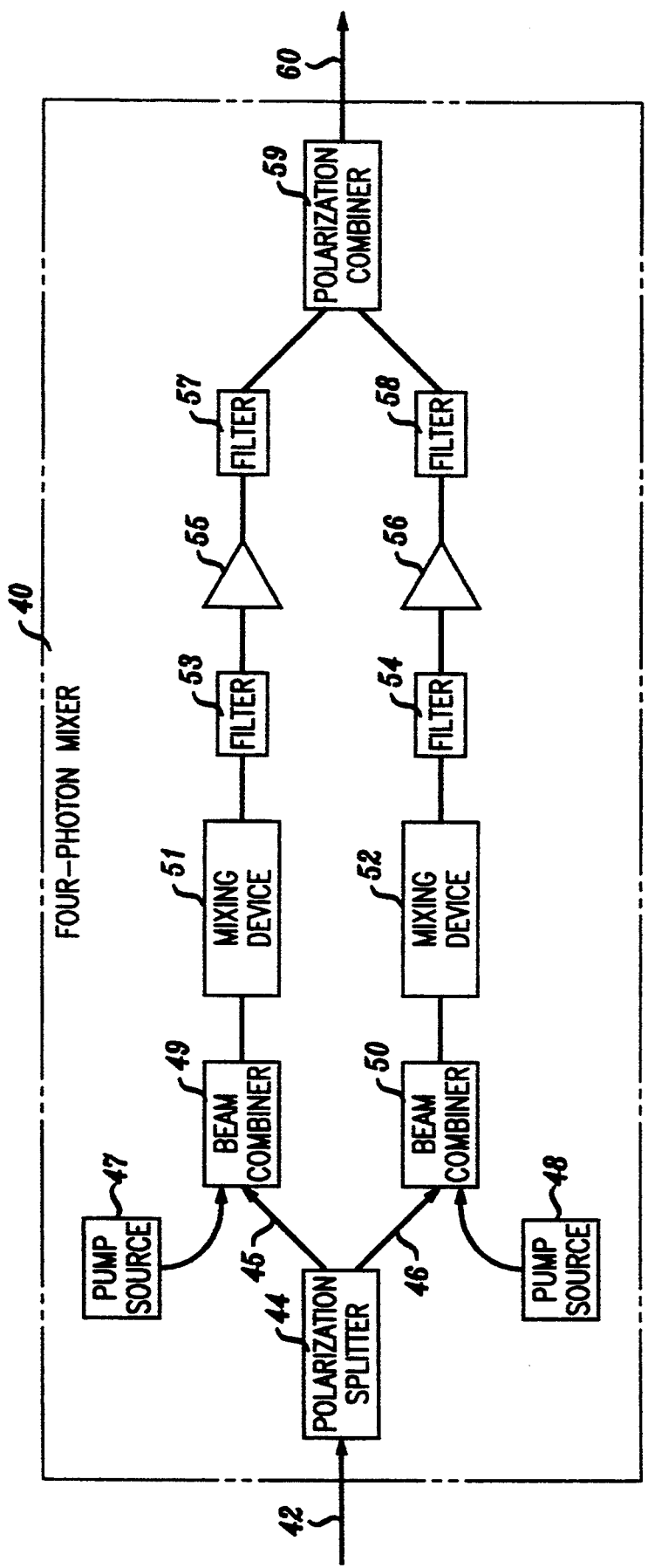
FIG. 4 is a schematic diagram of a polarization-insensitive optical four-photon mixing device in accordance with the present invention.

FIG. 4 shows one embodiment of an exemplary polarization-insensitive optical four-photon mixer in accordance with the present invention. The optical mixer 40 includes an optical signal input 42 and a polarization splitter 44. An optical communication signal is applied to optical signal input 42. The optical signal may be characterized as having both a TE and a TM polarization. For purposes of clarity, the TE polarization will be referred to herein as parallel and the TM as perpendicular. Polarization splitter 44 divides a single-channel optical signal into parallel and perpendicular polarization components. The parallel polarization component of the input optical signal is supplied via polarization splitter 44 to a first mixing path 45, while the perpendicular polarization component is supplied to a second mixing path 46. Mixing paths 45, 46 have pump sources 47, 48 respectively. The mutually-orthogonal pump signals produced in the first and second mixing paths 45, 46 are combined with their respective communication signal polarization components in beam combiners 49, 50 within paths 45, 46, respectively. The first and second beam combiners 49, 50 each couple a polarization-aligned pump and signal component together onto a single line which is fed into the first and second nonlinear mixing devices 51, 52 which may be semiconductor laser amplifiers. Within the first and second mixing devices 51, 52 the parallel and perpendicular signal components, respectively, are four-photon mixed with their respective substantially polarization-aligned pump signals.

In each of the paths 45, 46 a first filter 53, 54 receives a signal from mixing device 51, 52 which includes the pump, optical signal, and mixing product frequencies. The mixing product 2fp−fs is usually used as a phase conjugate product of degenerate mixing. The other signal frequencies are therefore eliminated by filtering in first filters 53, 54. The first filter 53, 54 in each path 45, 46 is then followed by an amplifier 55, 56 which amplifies the phase conjugate. The output of amplifiers 55, 56 is then preferably filtered by a second filter 57, 58 in order to limit ASE noise resulting from the amplification, as well as to further reject the input signal, pump and undesired mixing products. A polarization combiner 59 combines the orthogonally-polarized parallel and perpendicular mixing products. The output 60 of the combiner 59 is the desired phase conjugated version of the input optical signal.

An optical signal applied to optical signal input 42 is typically an optical communication signal which is to be frequency converted or phase conjugated as required for a given application. It should be noted that the optical signal may be either a single-channel signal or a multi-channel signal. Although FIG. 4 shows a single-channel embodiment of the present invention, the single-channel case can be extended to multi-channel optical systems. In certain applications, it may be advantageous to include one or more channel routers and multiple optical mixers, as will be discussed in greater detail below. The reference to TE and TM polarizations as parallel and perpendicular, respectively, indicates the spatial relationship between the signal polarizations in that the two polarizations are orthogonal to each other. As mentioned above, polarization splitter 44 divides a single-channel optical signal into parallel and perpendicular polarization components. The polarizations should be substantially orthogonal. Each has to coincide or be aligned with the polarization of its respective pump to produce maximum mixing efficiency. In this embodiment, degenerate four-photon mixing is used, with a single pump source in each mixing path. Two pump signals at two distinct frequencies could also be used in each path. Each pump source typically supplies an appropriately polarized pump signal having a power level of about 0.0 to 15.0 dbm (dB relative to 1 mW). Although not a requirement, pump signal power in practical systems is usually higher than the communication signal power. When using optical fiber as a mixing device, the effect of stimulated Brillouin scattering (SBS) places an upper limit on the desired pump power. SBS causes pump signal distortion, and usually begins to be a factor for pump powers in the range of 3.0 to 10.0 dBm. However, it should be noted that the SBS limit may be avoided by phase modulating the pump signal at a low frequency relative to the system data rates, but higher than the SBS frequency of 20 MHz. Thus, slow phase modulation of about 30 to 100 MHz on the pump signal will overcome the SBS effect and permit higher pump powers to be used. Absent such compensation for SBS, care should be taken in utilizing pump powers greater than 3.0 dBm with optical fiber mixing devices. For embodiments using short fiber lengths or active mixing devices such as semiconductor laser amplifiers, SBS is generally not a problem.

The two pump signals from sources 47, 48 should be mutually orthogonal because each is polarization-aligned with an orthogonally-polarized component of the input optical signal. Although the embodiment shown uses two separate pump sources 47 and 48, orthogonal pump signals could be derived from a single common pump source. In the case of a single pump source supplying both mixing paths, additional circuitry would be used to separate the single pump source into the orthogonal polarizations required.

In this embodiment, the nonlinear mixing devices 51, 52 are semiconductor laser amplifiers. However, other types of optical mixing devices could also be used, including non-dispersive fiber, dispersion-shifted fiber, semiconductor lasers, semiconductor laser amplifiers, or semiconductor material. Dispersion-shifted fiber is fiber which has been designed such that the dispersion is approximately zero at the operating wavelength. Thus, both non-dispersive fiber and dispersion-shifted fiber may be considered to have substantially no chromatic dispersion for the purposes of four-photon mixing. The distinction between a semiconductor laser amplifier and a semiconductor laser is the degree of optical feedback to the semiconductor gain medium. However, both semiconductor laser amplifiers and semiconductor lasers have four-photon mixing capabilities. A semiconductor laser amplifier is preferred in space constrained applications such as photonic integrated circuits. Within the first and second mixing devices 51, 52 the parallel and perpendicular signal components, respectively, are four-photon mixed with their respective substantially polarization-aligned pump signals. Mixing efficiency will be optimized for perfect alignment between the signal and pump polarizations in each path.

In order to ensure optimal polarization insensitivity in the above-described dual-path mixing arrangement, the optical length of the first and second paths should be substantially equivalent, within a fraction of an optical signal wavelength. Failure to maintain substantially equivalent optical lengths in paths 45, 46 will result in improper recombination of the signal polarizations. Precise equivalence in optical path length could be readily achieved by implementing the polarization-insensitive optical mixer as a photonic integrated circuit. All of the components shown, including the polarization splitter, the first and second mixing paths, and the polarization combiner, are preferably included within a single photonic integrated circuit. An exemplary embodiment of a photonic integrated circuit will be discussed below.

As mentioned above, each of the mixing paths 45, 46 may also include additional components to filter and amplify a desired mixing product. The embodiment shown in FIG. 4 includes exemplary filtering and amplification In each of the paths 45, 46 a first filter 53, 54 receives a signal from mixing device 51, 52 which includes the pump, optical signal, and mixing product frequencies. In the case of optical phase conjugation, a particular mixing product is desired, usually $2f_p - f_s$ for phase conjugation by degenerate mixing. The other signal frequencies should therefore be eliminated by filtering. The first filter 53, 54 performs this function in each path. If the frequency $2f_p - f_s$ is the desired output mixing product, the first filter 53, 54 should pass $2f_p - f_s$ while rejecting $f_p$ and $f_s$. The first filter 53, 54 in each path 45, 46 is then followed by an amplifier 55, 56 which amplifies the desired mixing product. Amplifiers 55, 56 will preferably be semiconductor laser amplifiers in photonic integrated circuit applications. Alternatively, other types of amplifiers including erbium-doped fiber amplifiers (EDFAs) could also be used. The output of amplifiers 55, 56 is then preferably filtered by a second filter 57, 58 in order to limit ASE noise resulting from the amplification, as well as to further reject the input signal, pump and undesired mixing products. Although this particular filtering and amplification arrangement is preferred for phase conjugation mixing applications, alternative arrangements may be used. The filter characteristics and amount of amplification needed will vary depending upon the application.

The embodiment of FIG. 4 further includes a polarization combiner 59 for combining the orthogonally-polarized parallel and perpendicular mixing products. The output of the combiner 59 is the desired frequency converted or phase conjugated version of the input optical signal. An optical signal of any polarity may therefore be applied to optical signal input 42, and the maximum amount of converted signal power will be obtained at output 60. By spatially separating the different polarizations of the input signal into components and separately mixing each component with an equivalently polarized pump, each mixing path always operates at or near optimal efficiency and therefore combined output power is maximized.

The present invention may also be practiced as a method of mixing an optical signal in which the converted signal output power is insensitive to the input signal polarization. The method would involve splitting an input optical signal into its parallel and perpendicular polarization components. The parallel component is passed through a first mixing path to mix with a first pump signal having a polarization substantially aligned with the polarization of the parallel component. The perpendicular component is passed through a second mixing path to mix with a second pump signal having a polarization substantially aligned with the polarization of the perpendicular component. The first and the second mixing paths have a substantially equivalent optical length and include nonlinear mixing devices which produce desired mixing products for both signal polarizations, parallel and perpendicular. The desired mixing products from the first and second mixing paths are combined in a polarization combiner to produce a frequency converted or phase conjugated version of the input optical signal. The method may include the additional steps of providing a pump source, beam combiner, amplifier and filters in both the first and second mixing paths in the arrangement discussed above in conjunction with FIG. 4.

Figure 5:
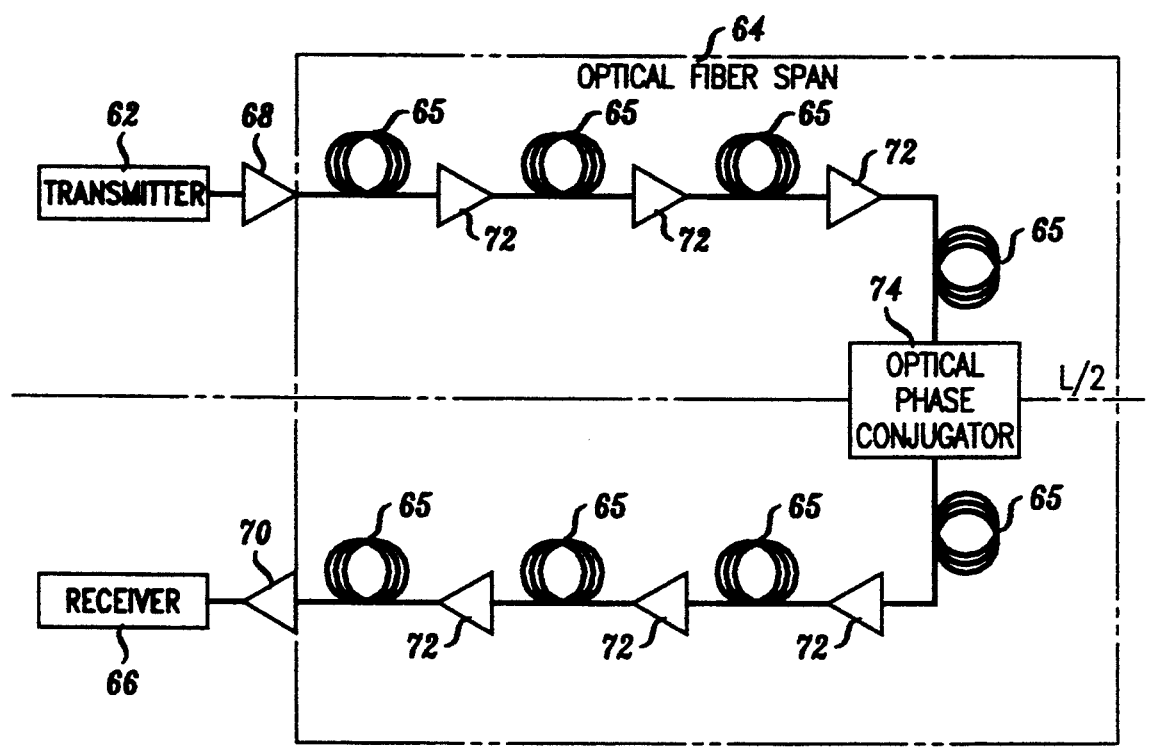
FIG. 5 is a block diagram of an optical communication system incorporating the polarization-insensitive four-photon mixer as a mid-system optical phase conjugator in order to balance first order fiber dispersion effects.

The above-described polarization-insensitive mixer is well-suited for use as a phase conjugator. FIG. 5 shows an optical communication system incorporating the polarization-insensitive optical mixer as a mid-system optical phase conjugator in order to balance first-order fiber dispersion effects. The exemplary optical communication system shown consists of an optical transmitter 62, a span of optical fiber 64, and an optical receiver 66. The fiber span 64 includes a plurality of fiber loops 65. The loops 65 represent lengths of optical fiber within the span. A booster amplifier 68 follows the transmitter 62, and a preamplifier 70 amplifies the optical signal before it arrives at the receiver. The optical fiber span 64 also includes a plurality of distributed erbium-doped fiber amplifiers 72 connected by the fiber loops 65 and appropriately spaced throughout the span so as to compensate for the attenuation of the optical fiber. A mid-system optical phase conjugator 74 is used to compensate for first-order dispersion effects within the fiber, as was discussed in greater detail above. The embodiment of the present invention shown in FIG. 4 serves as an optical phase conjugator 74. The optical phase conjugator 74 will therefore be independent of the polarization of the optical signal propagating from transmitter 62 down fiber span 64. Absent such polarization insensitivity, the phase conjugate signal power after the optical phase conjugator would randomly fluctuate as a function of optical signal polarization. Under the present invention, there is no significant conjugate power fluctuation as a function of signal polarization, and dispersion compensation is optimized. Similar advantages are obtained in other applications, such as frequency conversion.

Figure 6A:
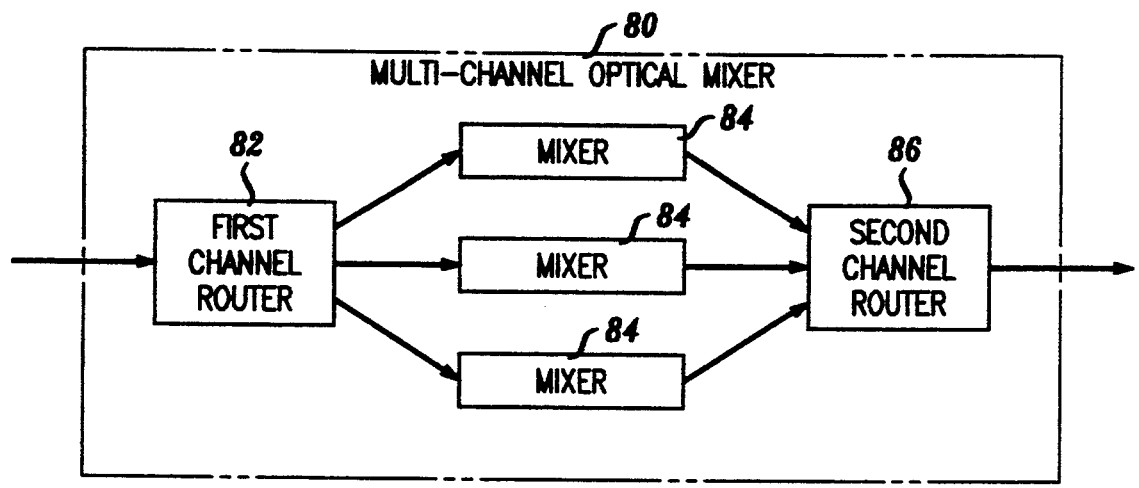
FIG. 6A is a block diagram of an exemplary preferred embodiment of a multi-channel polarization-insensitive optical four-photon mixer according to the present invention.

Although the above-discussed configurations are designed to operate for a single optical signal wavelength, the present invention may also be applied to multi-channel optical communication systems. FIG. 6A illustrates an exemplary preferred embodiment of a multi-channel polarization-insensitive optical mixer according to the present invention. The multi-channel optical mixer 80 includes a first channel router 82 which receives a multi-channel optical signal and separates it into its single-channel signals according to channel wavelength. The multi-channel signal typically consists of a number of discrete channel signals at different frequencies, each of which serves as a carrier for data. The multi-channel optical mixer also includes a plurality of single-channel polarization-insensitive optical mixers 84, each of which can phase conjugate or frequency convert one or more of the channel signals. Each optical mixer 84 is in the configuration shown in FIG. 4, and therefore each includes a polarization splitter, two mixing paths with nonlinear mixing devices, and a polarization combiner. In the preferred embodiment shown, each of the channel signals is routed to a single optical mixer 84. In each optical mixer 84, the desired polarization-insensitive mixing is carried out as described in the above discussion of FIG. 4.

After the polarization-insensitive mixing produces the desired mixing product output for a given input channel signal, the individual channel signal mixing products are recombined in a second channel router 86 such that the desired mixing product of the entire multi-channel signal is obtained. For example, to perform mid-system optical phase conjugation on a multi-channel system, the phase conjugate of the multi-channel signal must be obtained. The present invention provides the phase conjugate of the multi-channel signal by polarization-insensitive optical four-photon mixing of the individual channel signals.

Figure 6B:
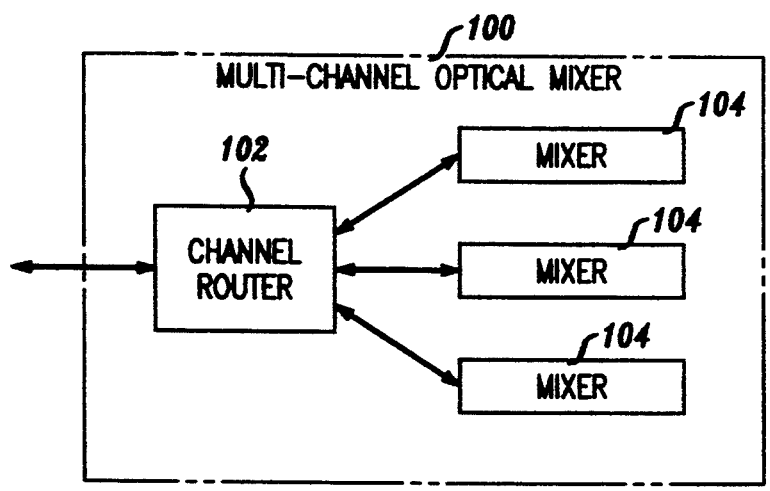
FIG. 6B is a block diagram of an alternative embodiment of a multi-channel polarization-insensitive optical four-photon mixer according to the present invention.

In an alternative embodiment of the multi-channel polarization-insensitive optical mixer of the present invention, shown in FIG. 6B as a multi-channel optical mixer 100, a channel router 102 is used in place of first and second channel routers 82, 86 of FIB. 6A. The channel router 102 routes optical signals in and out of a plurality of polarization-insensitive optical mixers 104. The channel router 102 performs the above-described functions of both first and second channel routers 82, 86.

The multi-channel aspects of the present invention may also be practiced as part of the above-described method by including the additional step of separating a multi-channel optical signal into a plurality of distinct optical signals in a first channel router. Each optical signal corresponds to at least one channel of the multi-channel optical signal, and each has a parallel and a perpendicular component. For each distinct optical signal, the method for the single-channel case is applied, producing the desired mixing product of each distinct optical signal. Finally, the desired mixing products of each optical signal are recombined into a multi-channel signal by passing them through a second channel router.

Figure 7:
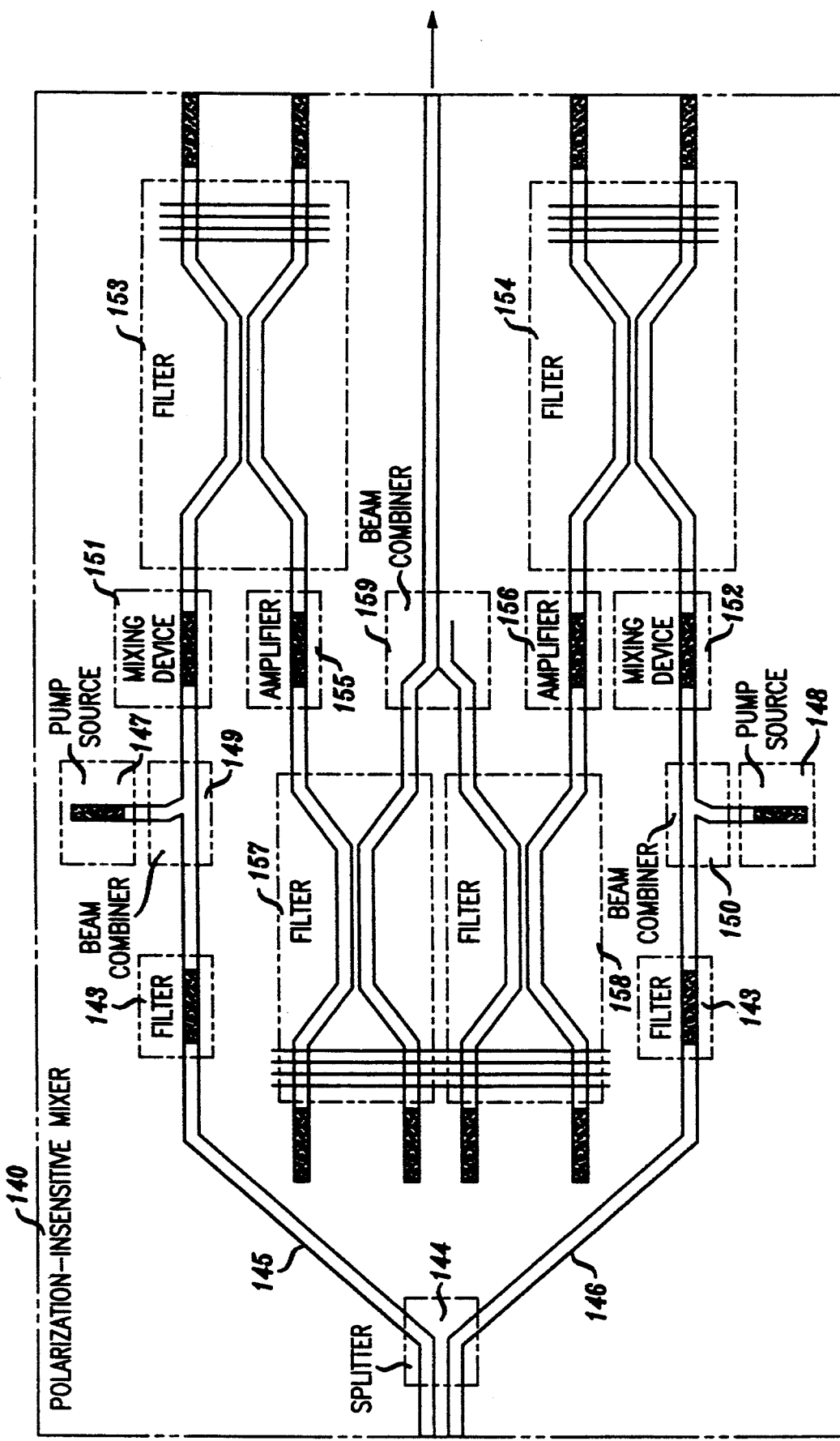
FIG. 7 is an exemplary photonic integrated circuit embodiment of the optical mixer of the present invention.

An exemplary embodiment of the present invention as a photonic integrated circuit is shown in FIG. 7. The polarization insensitive optical mixer 140 includes a polarization splitter 144 which splits the input optical signal into a parallel and perpendicular polarization. A filter 143, for example, a grating-assisted vertical coupler filter, may be placed in each of the different mixing paths 145, 146. Beam combiners 149, 150 combine the polarization components of the input signal with pump signals from pump sources 147, 148, respectively. The combined signals are mixed in mixing devices 151, 152. After mixing, first filters 153, 154, amplifiers 155, 156, and second filters 157, 158 operate in a manner similar to that described above in connection with FIG. 4. A beam combiner 159 is also provided. The filters 153, 154, 157 and 158 are used in a reflection mode. For further detail on these filters, and on filter 143, see R. Alferness et al , "Narrowband GaInAsP/InP Waveguide Grating-Folded Directional Coupler Multiplexor/Demultiplexor", Electronics Letters, vol. 24, no. 3, pp. 150–151, February 1988 and R. Alferness et al , "Grating-assisted InGaAsP/InP vertical codirectional coupler filter, "Applied Physics Letters, No. 56(19), November 1989. It should be understood that many alternative photonic integrated circuit implementations could also be used for the present invention.

The photonic integrated circuit embodiment of the present invention shown in FIG. 7 may also be used in a multi-channel optical communication system. In a wavelength division multiplexed (WDM) system with channel signal spacings on the order of several nanometers, input and output channel routing may be performed to separate the WDM channel comb into single-channel signals, each of which may be supplied to a separate optical mixer 140. In a frequency division multiplexed (FDM) system, with channel signal spacings on the order of tens of GHz, one or more Dragone routers may be used to separate the FDM signal into single-channels prior to mixing each channel signal in a separate mixer 140 See C Dragone, "An N×N Optical Multiplexer Using a Planar Arrangement of Two Star Couplers," IEEE Photonics Technology Letters, Vol. 3, No. 9, pp. 812–815, September, 1991. These routing arrangements are suitable for use with, optical mixers in general, but are particularly well-suited for use with the exemplary photonic integrated circuit embodiment of FIG. 7.

While the foregoing detailed description was primarily directed to polarization-insensitive optical four-photon mixing, it should be understood that the embodiments and applications discussed are exemplary only. For example, mixing processes other than four-photon mixing could be used, including parametric amplification and sum or difference frequency generation. Also, the invention could be useful in applications other than optical communications. As previously mentioned, the optical mixer is suitable for use in any application requiring optimal mixing of an optical signal. Certain hardware parameters, including but not limited to amplification, filtration, configuration of the pump source or sources, use of degenerate or non-degenerate mixing with one or more pump frequencies, and type of mixing device, may be altered to suit the needs of a given application. These and other alternatives and variations in the arrangements shown will be readily apparent to those skilled in the art, and the present invention is therefore limited only by the appended claims.

We claim:

1. A polarization-insensitive optical mixer comprising:
    a polarization splitter for splitting an optical signal into a parallel and a perpendicular polarization component;
    a first mixing path having a first nonlinear mixing device for mixing said parallel component of said optical signal with a first pump signal having a polarization substantially aligned with a polarization of said parallel component to produce a mixing product of said first pump signal and said parallel component;
    a second mixing path having a second nonlinear mixing device for mixing said perpendicular component of said optical signal with a second pump signal having a polarization substantially aligned with a polarization of said perpendicular component to produce mixing products of said second pump signal and said perpendicular component, said second mixing path having an optical length substantially equivalent to an optical length of said first mixing path; and
    a polarization combiner for combining said mixing products of said first and second pump signals and said parallel and perpendicular components to produce a desired mixing product of said optical signal.

2. The optical mixer of claim 1 wherein said desired mixing product of said optical signal is a phase conjugate of said optical signal.

3. The optical mixer of claim 1 wherein said desired mixing product of said optical signal is a frequency converted version of said optical signal.

4. The optical mixer of claim 1 wherein said first and said second nonlinear mixing devices are four-photon mixing devices.

5. The optical mixer of claim 1 wherein said first and said second nonlinear mixing devices are semiconductor laser amplifiers.

6. The optical mixer of claim 1 wherein said first and said second nonlinear mixing devices are optical fiber having substantially no chromatic dispersion.

7. The optical mixer of claim 1 wherein said first and said second pump signals for mixing with said components of said optical signal in each of said first and said second mixing paths are supplied by a single common pump source.

8. The optical mixer of claim 1 wherein each of said mixing paths further includes:
    a pump source for producing said pump signal; and
    a beam combiner adapted to receive and combine said pump signal and one of said components of said optical signal to produce a combined signal;
    wherein said nonlinear mixing device in said mixing path is adapted to receive said combined signal from said beam combiner and to produce said mixing product of said pump signal and said one of said components of said optical signal.

9. The optical mixer of claim 8 wherein each of said mixing paths further includes:
    a first filter adapted to receive said mixing product from said mixing device and to attenuate a signal other than said mixing product of said pump signal and said one of said components of said optical signal;
    an amplifier adapted to receive and amplify said mixing product of said pump signal and said one of said components from said first filter; and
    a second filter adapted to receive said mixing product from said amplifier and to filter noise from said mixing product.

10. The optical mixer of claim 1 wherein said polarization splitter, said first and second mixing paths, and said polarization combiner are implemented as a photonic integrated circuit.

11. The optical mixer of claim 1 wherein said optical signal is a single-channel optical signal.

12. The optical mixer of claim 1 wherein said optical signal is a multi-channel optical signal.

13. The optical mixer of claim 1 wherein said first and said second pump signals have substantially the same frequency.

14. The optical mixer of claim 1 wherein said first and said second pump signals have distinct frequencies.

15. A multi-channel optical mixer comprising:
    a first channel router for receiving a multi-channel optical signal and separating said multi-channel optical signal into distinct channel signals; and
    a plurality of polarization-insensitive optical mixers, each of said polarization-insensitive optical mixers separating at least one of said channel signals into a parallel and a perpendicular polarization component, and mixing said parallel and said perpendicular component with a first and a second pump signal, respectively, to produce a polarization-insensitive mixing product of said at least one channel signal 16. The multi-channel optical mixer of claim 15 further including:
a second channel router for receiving said mixing products of said channel signals from said polarization-insensitive optical mixers and combining said mixing products of said channel signals to produce a desired mixing product of said multi-channel optical signal.

17. The multi-channel optical mixer of claim 16 wherein said desired mixing product of said multi-channel optical signal is a phase conjugate of said multi-channel optical signal.

18. The multi-channel optical mixer of claim 15 wherein each of said polarization-insensitive optical mixers includes:
a polarization splitter for splitting said optical channel signal into said parallel and said perpendicular polarization component;
a first mixing path having a first nonlinear mixing device for mixing said parallel component of said optical channel signal with a first pump signal having a polarization substantially aligned with a polarization of said parallel component to produce a mixing product of said first pump signal and said parallel component;
a second mixing path having a second nonlinear mixing device for mixing said perpendicular component of said optical channel signal with a second pump signal having a polarization substantially aligned with a polarization of said perpendicular component to produce a mixing product of said second pump signal and said perpendicular component, said second mixing path having an optical length substantially equivalent to an optical length of said first mixing path; and
a polarization combiner for combining mixing products of said pump signals and said parallel and perpendicular components of said optical channel signal to produce a desired mixing product of said optical channel signal.

19. A method of polarization-insensitive optical mixing of an optical signal comprising the steps of:
splitting said optical signal into a parallel and a perpendicular polarization component;
passing said parallel component through a first mixing path having a first nonlinear mixing device for mixing said parallel component of said optical signal with a first pump signal having a polarization substantially aligned with a polarization of said parallel component to produce a mixing product of said first pump signal and said parallel component;
passing said perpendicular component through a second mixing path having a second nonlinear mixing device for mixing said perpendicular component of said optical signal with a second pump signal having a polarization substantially aligned with a polarization of said perpendicular component to produce a mixing product of said second pump signal and said perpendicular component, said second mixing path having an optical length substantially equivalent to an optical length of said first mixing path; and
combining said mixing products of said pump signals and said parallel and perpendicular components of said optical signal in a polarization combiner to produce a desired mixing product of said optical signal.

20. The method of claim 19 wherein said step of combining said mixing products of said pump signals and said parallel and perpendicular components to produce a desired mixing product of said optical signal produces a phase conjugate of said optical signal.

21. The method of claim 19 further including the steps of:
providing a pump source in each of said first and said second mixing paths for producing said first and said second pump signals; and
providing a beam combiner in each of said first and said second mixing paths adapted to receive and combine one of said pump signals and one of said components of said optical signal to produce a combined signal to be supplied to one of said nonlinear mixing devices.

22. The method of claim 21 further including the step of providing a first filter in each of said first and said second mixing paths to attenuate a signal other than said mixing product of said one of said components of said optical signal.

23. The method of claim 22 further including the steps of:
providing an amplifier in each of said first and said second mixing paths to amplify said mixing product of said one of said components; and
providing a second filter in each of said first and said second mixing paths to filter amplified noise from said mixing product of said one of said components.

24. The method of claim 19 further including the steps of:
separating a multi-channel optical signal into a plurality of distinct optical signals by passing said multi-channel signal through a first channel router, each optical signal corresponding to at least one channel of said multi-channel optical signal, and each having a parallel and a perpendicular component; and
combining desired mixing products of each of said distinct optical signals by passing each of said mixing products through a second channel router, to thereby produce a desired mixing product of said multi-channel optical signal.

25. The method of claim 19 wherein said step of splitting said optical signal includes splitting a single-channel signal into said parallel and perpendicular components.

26. The method of claim 19 wherein said step of splitting said optical signal includes splitting a multi-channel signal into said parallel and perpendicular components.

27. The method of claim 19 further including the step of providing said first and said second pump signals at substantially the same frequency.

28. The method of claim 19 further including the step of providing said first and said second pump signals at distinct frequencies.

29. A multi-channel optical mixer comprising:
a channel router for receiving a multi-channel optical signal and separating said multi-channel optical signal into distinct channel signals; and
a plurality of polarization-insensitive optical mixers, each of said polarization-insensitive mixers separating at least one of said channel signals into a parallel and a perpendicular polarization component, and mixing said parallel and said perpendicular component with a first and a second pump signal, respectively, to produce a polarization-insensitive mixing product of said at least one channel signal;

wherein said channel router receives said mixing products of said channel signals from said polarization-insensitive mixers, and combines said mixing products of said channel signals to produce a desired mixing product of said multi-channel signal.

30. The multi-channel optical mixer of claim 29 wherein said desired mixing product of said multi-channel optical signal is a phase conjugate of said multi-channel optical signal.

31. A method of polarization-insensitive optical mixing of a multi-channel optical signal, comprising the steps of:

separating said multi-channel optical signal into a plurality of distinct channel signals; and providing a plurality of polarization-insensitive optical mixers, each of said polarization-insensitive mixers separating at least one of said channel signals into a parallel and a perpendicular polarization component, and mixing said parallel and said perpendicular component with a first and a second pump signal, respectively, to produce a polarization-insensitive mixing product of said at least one channel signal.

32. The method of claim 31 further including the step of combining said mixing products of said channel signals from said plurality of polarization-insensitive optical mixers to produce a desired mixing product of said multi-channel optical signal.

33. The method of claim 32 wherein said step of combining said mixing products of said channel signals to produce a desired mixing product of said multi-channel optical signal includes producing a phase conjugate of said multi-channel optical signal.

* * * * *